United States Patent
Patel et al.

(10) Patent No.: US 11,281,389 B2
(45) Date of Patent: Mar. 22, 2022

(54) METHOD AND SYSTEM FOR INLINE DEDUPLICATION USING ERASURE CODING

(71) Applicant: Dell Products L.P., Hopkinton, MA (US)

(72) Inventors: Dharmesh M. Patel, Round Rock, TX (US); Rizwan Ali, Cedar Park, TX (US); Ravikanth Chaganti, Bangalore (IN)

(73) Assignee: Dell Products L.P., Hopkinton, MA (US)

( * ) Notice: Subject to any disclaimer, the term of this patent is extended or adjusted under 35 U.S.C. 154(b) by 0 days.

(21) Appl. No.: 17/100,178

(22) Filed: Nov. 20, 2020

(65) Prior Publication Data

US 2021/0072912 A1 Mar. 11, 2021

Related U.S. Application Data

(63) Continuation of application No. 16/260,734, filed on Jan. 29, 2019, now abandoned.

(51) Int. Cl.
*G06F 3/06* (2006.01)
*G06F 11/10* (2006.01)

(52) U.S. Cl.
CPC .......... *G06F 3/0641* (2013.01); *G06F 3/065* (2013.01); *G06F 3/0608* (2013.01); *G06F 3/0619* (2013.01); *G06F 3/0673* (2013.01); *G06F 11/1076* (2013.01)

(58) Field of Classification Search
CPC ... G06F 3/0641; G06F 3/0608; G06F 11/1076
See application file for complete search history.

(56) References Cited

U.S. PATENT DOCUMENTS

| | | | |
|---|---|---|---|
| 4,780,809 | A | 10/1988 | Woffinden et al. |
| 5,689,678 | A | 11/1997 | Stallmo et al. |
| 6,098,098 | A | 8/2000 | Sandahl et al. |
| 6,223,252 | B1 | 4/2001 | Bandera et al. |
| 6,516,425 | B1 | 2/2003 | Belhadj et al. |
| 7,636,814 | B1 | 12/2009 | Karr et al. |
| 7,882,386 | B1 | 2/2011 | Potnis et al. |
| 7,987,353 | B2 | 7/2011 | Holdaway et al. |
| 8,037,345 | B1 | 10/2011 | Iyer et al. |

(Continued)

FOREIGN PATENT DOCUMENTS

WO 2015114643 A1 8/2015

OTHER PUBLICATIONS

"Features—RoboHead"; Project Management Software for Marketing & Creative Teams, Aquent; 2018 (https://www.robohead.net/features) (2 pages).

(Continued)

*Primary Examiner* — David E Martinez
(74) *Attorney, Agent, or Firm* — Chamberlain, Hrdlicka, White, Williams & Aughtry

(57) ABSTRACT

A method includes obtaining a data, applying an erasure coding procedure to the data to obtain a plurality of data chunks and at least one parity chunk, deduplicating the plurality of data chunks to obtain a plurality of deduplicated data chunks, and storing, across a plurality of nodes, the plurality of deduplicated data chunks and the at least one parity chunk.

17 Claims, 7 Drawing Sheets

(56) References Cited

U.S. PATENT DOCUMENTS

| | | |
|---|---|---|
| 8,099,571 B1 | 1/2012 | Driscoll et al. |
| 8,161,255 B2 | 4/2012 | Anglin et al. |
| 8,190,835 B1 | 5/2012 | Yueh |
| 8,364,917 B2 | 1/2013 | Bricker et al. |
| 8,386,930 B2 | 2/2013 | Dillenberger et al. |
| 8,583,769 B1 | 11/2013 | Peters et al. |
| 8,788,466 B2 | 7/2014 | Anglin et al. |
| 8,868,987 B2 | 10/2014 | Wagner |
| 8,874,892 B1 | 10/2014 | Chan et al. |
| 8,898,114 B1 | 11/2014 | Feathergill et al. |
| 8,949,208 B1 | 2/2015 | Xu et al. |
| 9,122,501 B1 | 9/2015 | Hsu et al. |
| 9,201,751 B1 | 12/2015 | Muthirisavenugopal et al. |
| 9,256,378 B2 | 2/2016 | Zheng et al. |
| 9,256,381 B1 | 2/2016 | Fultz et al. |
| 9,278,481 B2 | 3/2016 | Hull |
| 9,355,036 B2 | 5/2016 | Beard et al. |
| 9,521,198 B1 | 12/2016 | Agarwala et al. |
| 9,696,939 B1 | 7/2017 | Frank et al. |
| 9,710,367 B1 | 7/2017 | Nagineni |
| 9,749,480 B1 | 8/2017 | Katano |
| 9,792,316 B1 | 10/2017 | Cremelie |
| 9,830,111 B1 | 11/2017 | Patiejunas et al. |
| 9,898,224 B1 | 2/2018 | Marshak et al. |
| 10,002,048 B2 | 6/2018 | Chennamsetty et al. |
| 10,013,323 B1 | 7/2018 | Puhov et al. |
| 10,013,325 B1 | 7/2018 | Garrett, Jr. et al. |
| 10,031,672 B2 | 7/2018 | Wang et al. |
| 10,057,184 B1 | 8/2018 | Prahlad et al. |
| 10,091,295 B1 | 10/2018 | Savic et al. |
| 10,097,620 B2 | 10/2018 | Reddy et al. |
| 10,152,254 B1 | 12/2018 | Kang et al. |
| 10,185,624 B2 | 1/2019 | Akutsu et al. |
| 10,241,695 B2 | 3/2019 | Baptist et al. |
| 10,339,455 B1 | 7/2019 | Parush-Tzur et al. |
| 10,409,778 B1 | 9/2019 | Zhao et al. |
| 10,452,301 B1 | 10/2019 | Farhan |
| 10,503,413 B1 | 12/2019 | Gal et al. |
| 10,503,611 B1 | 12/2019 | Srivastav et al. |
| 10,528,429 B1 | 1/2020 | Vempati et al. |
| 10,817,392 B1 | 10/2020 | Mcauliffe et al. |
| 10,929,256 B2 | 2/2021 | Danilov et al. |
| 10,956,601 B2 | 3/2021 | Surla et al. |
| 10,963,345 B2 | 3/2021 | Patel et al. |
| 10,990,480 B1 | 4/2021 | Bernat et al. |
| 11,005,468 B1 | 5/2021 | Subramanian et al. |
| 11,112,990 B1 | 9/2021 | Bernat et al. |
| 2001/0044879 A1 | 11/2001 | Moulton et al. |
| 2003/0036882 A1 | 2/2003 | Harper et al. |
| 2003/0058277 A1 | 3/2003 | Bowman-Amuah |
| 2003/0065873 A1 | 4/2003 | Collins et al. |
| 2003/0172145 A1 | 9/2003 | Nguyen |
| 2003/0177205 A1 | 9/2003 | Liang et al. |
| 2004/0128587 A1 | 7/2004 | Kenchammana-Hosekote et al. |
| 2004/0153844 A1 | 8/2004 | Ghose et al. |
| 2004/0260967 A1 | 12/2004 | Guha et al. |
| 2005/0076049 A1 | 4/2005 | Qubti et al. |
| 2005/0086557 A1 | 4/2005 | Sato et al. |
| 2005/0182797 A1 | 8/2005 | Adkins et al. |
| 2005/0262385 A1 | 11/2005 | Mcneill et al. |
| 2005/0283655 A1 | 12/2005 | Ashmore |
| 2007/0214255 A1 | 9/2007 | Spitz et al. |
| 2007/0283011 A1 | 12/2007 | Rakowski et al. |
| 2008/0244204 A1 | 10/2008 | Cremelie et al. |
| 2009/0077165 A1 | 3/2009 | Rhodes et al. |
| 2009/0094250 A1 | 4/2009 | Dhuse et al. |
| 2009/0235022 A1 | 9/2009 | Bates et al. |
| 2009/0265360 A1 | 10/2009 | Bachwani et al. |
| 2010/0061207 A1 | 3/2010 | Trantham |
| 2010/0138604 A1 | 6/2010 | Noguchi et al. |
| 2011/0099351 A1 | 4/2011 | Condict |
| 2011/0173484 A1 | 7/2011 | Schuette et al. |
| 2011/0197024 A1 | 8/2011 | Thomas |
| 2011/0246597 A1 | 10/2011 | Swanson et al. |
| 2012/0096309 A1 | 4/2012 | Kumar et al. |
| 2013/0047029 A1 | 2/2013 | Ikeuchi et al. |
| 2013/0067459 A1 | 3/2013 | Sannidhanam et al. |
| 2013/0086006 A1 | 4/2013 | Colgrove |
| 2013/0151683 A1 | 6/2013 | Jain et al. |
| 2013/0339818 A1 | 12/2013 | Baker et al. |
| 2014/0020083 A1 | 1/2014 | Fetik |
| 2014/0032834 A1 | 1/2014 | Cudak et al. |
| 2014/0059311 A1 | 2/2014 | Oberhofer et al. |
| 2014/0089265 A1 | 3/2014 | Talagala et al. |
| 2014/0089630 A1 | 3/2014 | Pignatelli |
| 2014/0285917 A1 | 9/2014 | Cudak et al. |
| 2014/0297603 A1 | 10/2014 | Kim et al. |
| 2015/0012775 A1 | 1/2015 | Cudak et al. |
| 2015/0046756 A1 | 2/2015 | Sreekumaran et al. |
| 2015/0058582 A1* | 2/2015 | Baldwin ............... G06F 3/0641 711/158 |
| 2015/0095596 A1 | 4/2015 | Yang |
| 2015/0161000 A1 | 6/2015 | Kim et al. |
| 2015/0205657 A1 | 7/2015 | Clark |
| 2015/0205669 A1 | 7/2015 | Sundaram et al. |
| 2015/0220400 A1 | 8/2015 | Resch et al. |
| 2015/0227602 A1 | 8/2015 | Ramu et al. |
| 2015/0286545 A1 | 10/2015 | Brown |
| 2015/0355980 A1 | 12/2015 | Volvovski et al. |
| 2016/0013988 A1 | 1/2016 | Andrews |
| 2016/0062674 A1 | 3/2016 | Benight et al. |
| 2016/0070652 A1 | 3/2016 | Sundararaman et al. |
| 2016/0077933 A1 | 3/2016 | Ventura et al. |
| 2016/0085630 A1 | 3/2016 | Gardner |
| 2016/0246537 A1 | 8/2016 | Kim |
| 2017/0090767 A1 | 3/2017 | Poston et al. |
| 2017/0099187 A1 | 4/2017 | Dale et al. |
| 2017/0147437 A1 | 5/2017 | Bodick et al. |
| 2017/0160983 A1 | 6/2017 | Fiske et al. |
| 2017/0192865 A1 | 7/2017 | Pan |
| 2017/0192868 A1 | 7/2017 | Vijayan et al. |
| 2017/0206034 A1 | 7/2017 | Fetik |
| 2017/0235609 A1 | 8/2017 | Wires et al. |
| 2017/0308536 A1 | 10/2017 | Azzam et al. |
| 2018/0018227 A1 | 1/2018 | Kazi |
| 2018/0018235 A1 | 1/2018 | Arslan et al. |
| 2018/0060894 A1 | 3/2018 | Beveridge et al. |
| 2018/0157532 A1 | 6/2018 | Kumar et al. |
| 2018/0165169 A1 | 6/2018 | Camp et al. |
| 2018/0189109 A1 | 7/2018 | Nagai et al. |
| 2018/0217898 A1 | 8/2018 | Tormasov |
| 2018/0260123 A1 | 9/2018 | Andresen et al. |
| 2018/0278597 A1 | 9/2018 | Helms et al. |
| 2018/0284987 A1 | 10/2018 | Lazier |
| 2018/0307560 A1 | 10/2018 | Vishnumolakala et al. |
| 2018/0370756 A1 | 10/2018 | Vishnumolakala et al. |
| 2018/0314607 A1 | 11/2018 | Deshpande et al. |
| 2018/0322558 A1 | 11/2018 | Padmanabh et al. |
| 2018/0356998 A1 | 12/2018 | Wu et al. |
| 2019/0050263 A1 | 2/2019 | Patel et al. |
| 2019/0104398 A1 | 4/2019 | Owen et al. |
| 2019/0108099 A1 | 4/2019 | Mazumdar |
| 2019/0109772 A1 | 4/2019 | Lipstone et al. |
| 2019/0197023 A1 | 6/2019 | Chennamsetty et al. |
| 2019/0332473 A1 | 10/2019 | Yang et al. |
| 2019/0332502 A1 | 10/2019 | Ma et al. |
| 2019/0361850 A1 | 11/2019 | Uno et al. |
| 2019/0379588 A1 | 12/2019 | Rao |
| 2020/0026439 A1 | 1/2020 | Gao et al. |
| 2020/0034257 A1 | 1/2020 | Mahmood et al. |
| 2020/0042388 A1 | 2/2020 | Roberts |
| 2020/0050689 A1 | 2/2020 | Tal et al. |
| 2020/0065191 A1 | 2/2020 | Zhou |
| 2020/0133503 A1 | 4/2020 | Sun et al. |
| 2020/0175038 A1 | 6/2020 | Guan et al. |
| 2020/0201837 A1 | 6/2020 | Motwani et al. |
| 2020/0257457 A1* | 8/2020 | Matsugami ......... G06F 12/0246 |

OTHER PUBLICATIONS

"Make more time for the work that matters most"; Asana, Inc.; 2017 (https://asana.com/) (7 pages).

(56) References Cited

OTHER PUBLICATIONS

"Online Project Management Tools & Features"; ProWorkflow; Jun. 2015 (https://www.proworkflow.com/features-project-management-tools/) (7 pages).
Extended European Search Report issued in corresponding European Application No. 2152194.5, dated Jun. 29, 2020 (10 pages).
Extended European Search Report issued in corresponding European Application No. 20152195.2, dated Jun. 2, 2020 (6 pages).
Suzhen Wu et al. ;"Improving Reliability of Deduplication-based Storage Systems with Per-File Parity"; 2018 IEEE 37th International Symposium on Reliable Distributed Systems (SRDS); Salvador, Brazil; 2018; pp. 171-180 (DOI:10.1109/SRDS.2018.00028) (10 pages).
Extended European Search Report issued in corresponding European App. No. 20152195.2, dated Jun. 2, 2020.
Wu, Suzhen, et al., "Improving Reliability of Deduplication-based Storage Systems with Per-File Parity," 2018 IEEE 37th International Symposium on Reliable Distributed Systems (SRDS); Salvador, Brazil; 2018, pp. 171-180 (DOI:10.1109/SRDS.2018.00028).
"Make more time for the work that matters most", Asana, Inc., 2017 (https://asana.com/), 5 pages.

\* cited by examiner

METHOD AND SYSTEM FOR INLINE DEDUPLICATION USING ERASURE CODING

BACKGROUND

Computing devices may include any number of internal components such as processors, memory, and persistent storage. Each of the internal components of a computing device may be used to generate data. The process of generating, storing, and backing-up data may utilize computing resources of the computing devices such as processing and storage. The utilization of the aforementioned computing resources to generate backups may impact the overall performance of the computing resources.

SUMMARY

In general, in one aspect, the invention relates to a method for managing data in accordance with one or more embodiments of the invention. The method includes obtaining data, applying an erasure coding procedure to the data to obtain a plurality of data chunks and at least one parity chunk, deduplicating the plurality of data chunks to obtain a plurality of deduplicated data chunks, and storing, across a plurality of nodes, the plurality of deduplicated data chunks and the at least one parity chunk.

In one aspect, a non-transitory computer readable medium in accordance with one or more embodiments of the invention includes computer readable program code, which when executed by a computer processor enables the computer processor to perform a method for managing data. The method includes obtaining data, applying an erasure coding procedure to the data to obtain a plurality of data chunks and at least one parity chunk, deduplicating the plurality of data chunks to obtain a plurality of deduplicated data chunks, and storing, across a plurality of nodes, the plurality of deduplicated data chunks and the at least one parity chunk.

In one aspect, a data cluster in accordance with one or more embodiments of the invention includes data nodes comprising an accelerator pool and a non-accelerator pool. The accelerator pool comprises a data node, and the non-accelerator pool comprises a plurality of data nodes. A data node of the plurality of nodes is programmed to obtain data, apply an erasure coding procedure to the data to obtain a plurality of data chunks and at least one parity chunk, deduplicate the plurality of data chunks to obtain a plurality of deduplicated data chunks, and store, across the plurality of nodes, the plurality of deduplicated data chunks and the at least one parity chunk.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

In general, embodiments of the invention relate to a method and system for storing data in a data cluster. Embodiments of the invention may utilize a deduplicator, operating in an accelerator pool, which applies an erasure coding procedure on data obtained from a host to divide the data into data chunks and to generate parity chunks using the data chunks. The deduplicator may then perform deduplication on the data chunks to generate deduplicated data chunks. The deduplicated data chunks and the parity chunks are subsequently distributed to nodes in the data cluster in accordance with an erasure coding procedure.

Figure 1A:
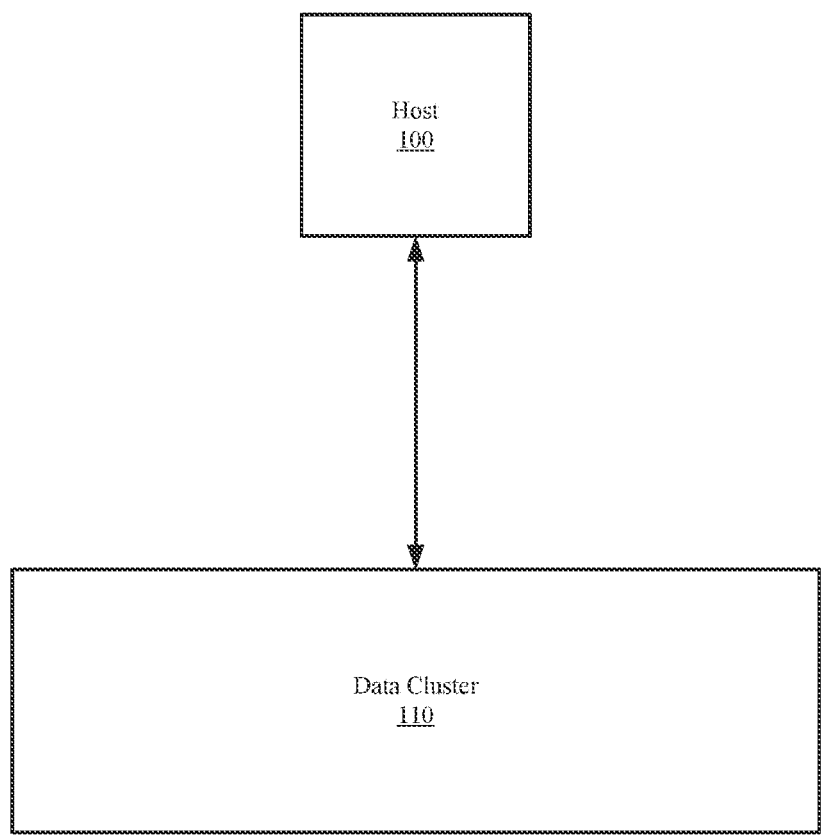
FIG. 1A shows a diagram of a system in accordance with one or more embodiments of the invention.

FIG. 1A shows an example system in accordance with one or more embodiments of the invention. The system includes a host (100) and a data cluster (110). The host (100) is operably connected to the data cluster (110) via any combination of wired and/or wireless connections.

In one or more embodiments of the invention, the host (100) utilizes the data cluster (110) to store data. The data stored may be backups of databases, files, applications, and/or other types of data without departing from the invention.

In one or more embodiments of the invention, the host (100) is implemented as a computing device (see e.g., FIG.

4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the host (100) described throughout this application.

In one or more embodiments of the invention, the host (100) is implemented as a logical device. The logical device may utilize the computing resources of any number of computing devices and thereby provide the functionality of the host (100) described throughout this application.

In one or more embodiments of the invention, the data cluster (110) stores data and/or backups of data generated by the host (100). The backups may be deduplicated versions of backups obtained from the host. The data cluster may, via an erasure coding procedure, store portions of the deduplicated data across the nodes operating in the data cluster (110).

As used herein, deduplication refers to methods of storing only portions of files (also referred to as file segments or segments) that are not already stored in persistent storage. For example, when multiple versions of a large file, having only minimal differences between each of the versions, are stored without deduplication, storing each version will require approximately the same amount of storage space of a persistent storage. In contrast, when the multiple versions of the large file are stored with deduplication, only the first version of the multiple versions stored will require a substantial amount of storage. Once the first version is stored in the persistent storage, the subsequent versions of the large file subsequently stored will be de-duplicated before being stored in the persistent storage resulting in much less storage space of the persistent storage being required to store the subsequently stored versions when compared to the amount of storage space of the persistent storage required to store the first stored version.

Continuing with the discussion of FIG. 1A, the data cluster (110) may include nodes that each store any number of deduplicated data chunks. The deduplicated data chunks may be portions of data obtained by other nodes or obtained from the host (100). For additional details regarding the data cluster (110), see, e.g., FIG. 1B.

Figure 1B:
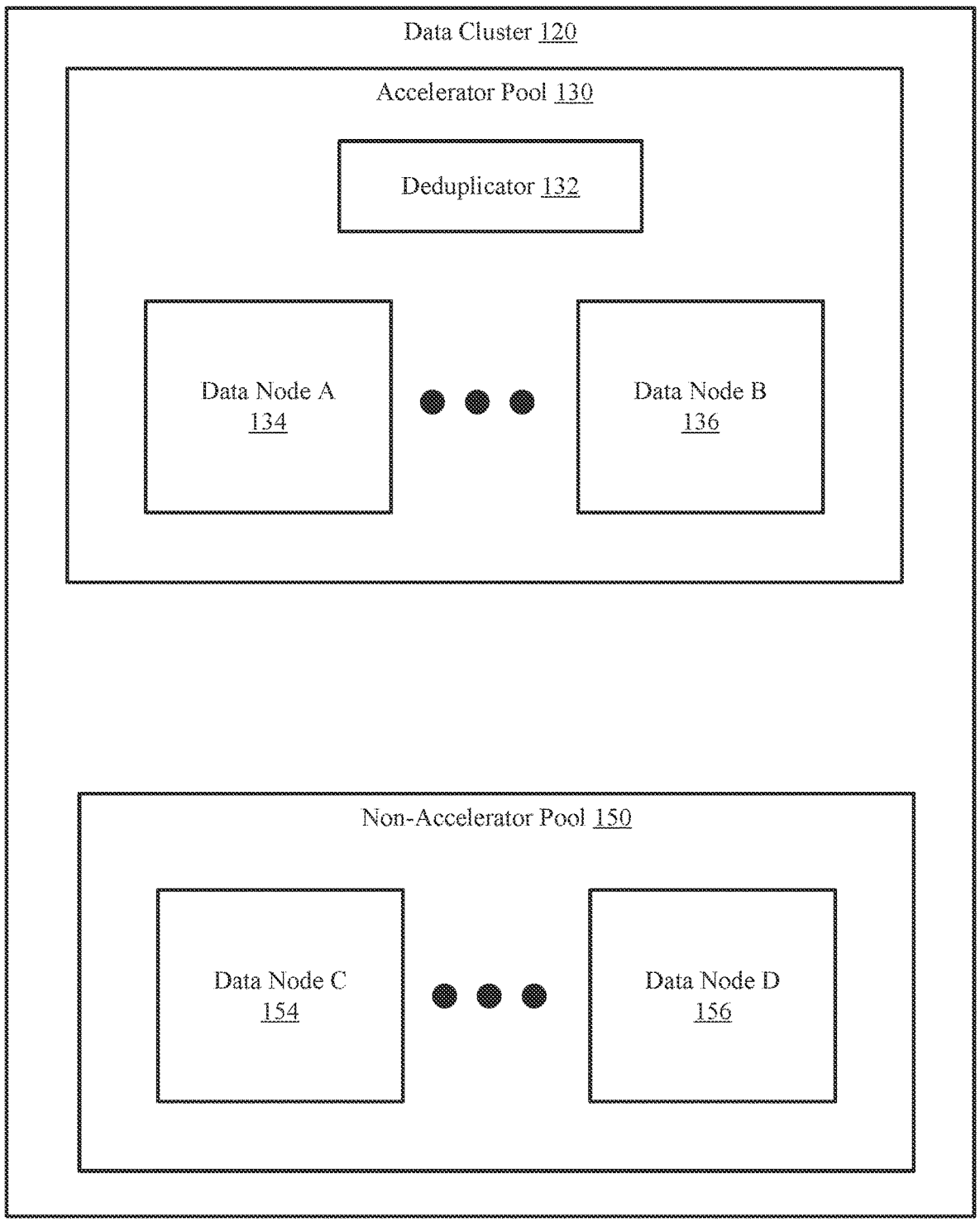
FIG. 1B shows a diagram of a data cluster in accordance with one or more embodiments of the invention.

FIG. 1B shows a diagram of a data cluster (120) in accordance with one or more embodiments of the invention. The data cluster (120) may be an embodiment of the data cluster (110, FIG. 1A) discussed above. The data cluster (120) may include an accelerator pool (130) and a non-accelerator pool (150). The accelerator pool (130) may include a deduplicator(s) (132) and any number of data nodes (134, 136). Similarly, the non-accelerator pool (150) includes any number of data nodes (154, 156). The components of the data cluster (120) may be operably connected via any combination of wired and/or wireless connections. Each of the aforementioned components is discussed below.

In one or more embodiments of the invention, the deduplicator(s) (132) is a device that includes functionality to perform deduplication on data obtained from a host (e.g., 100, FIG. 1A). The deduplicator (132) may store information useful to perform the aforementioned functionality. The information may include deduplication identifiers (D-IDs). A D-ID is a unique identifier that identifies portions of data (also referred to as data chunks) that are stored in the data cluster (120). The D-ID may be used to determine whether a data chunk of obtained data is already present elsewhere in the accelerator pool (140) or the non-accelerator pool (150). The deduplicator (132) may use the information to perform the deduplication and generate deduplicated data. After deduplication, an erasure coding procedure may be performed on the deduplicated data in order to generate parity chunks. The deduplicator (132) may perform the deduplication and erasure coding procedure via the method illustrated in FIG. 2.

Figure 2:
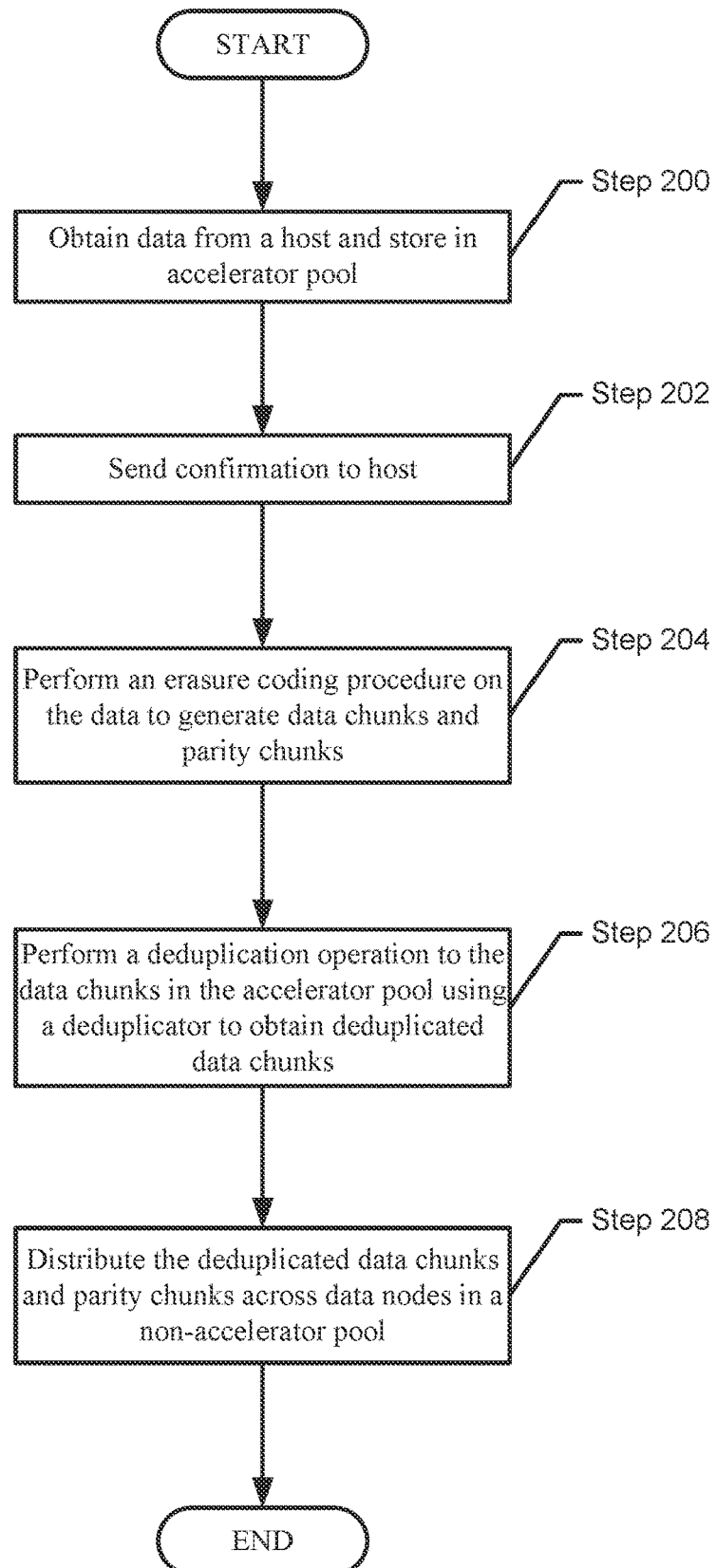
FIG. 2 shows a flowchart for storing data in a data cluster in accordance with one or more embodiments of the invention.

In one or more embodiments of the invention, the deduplicator (132) is implemented as computer instructions, e.g., computer code, stored on a persistent storage that when executed by a processor of a data node (e.g., 134, 136) of the accelerator pool (140) cause the data node to provide the aforementioned functionality of the deduplicator (132) described throughout this application and/or all, or a portion thereof, of the method illustrated in FIG. 2.

Figure 4:
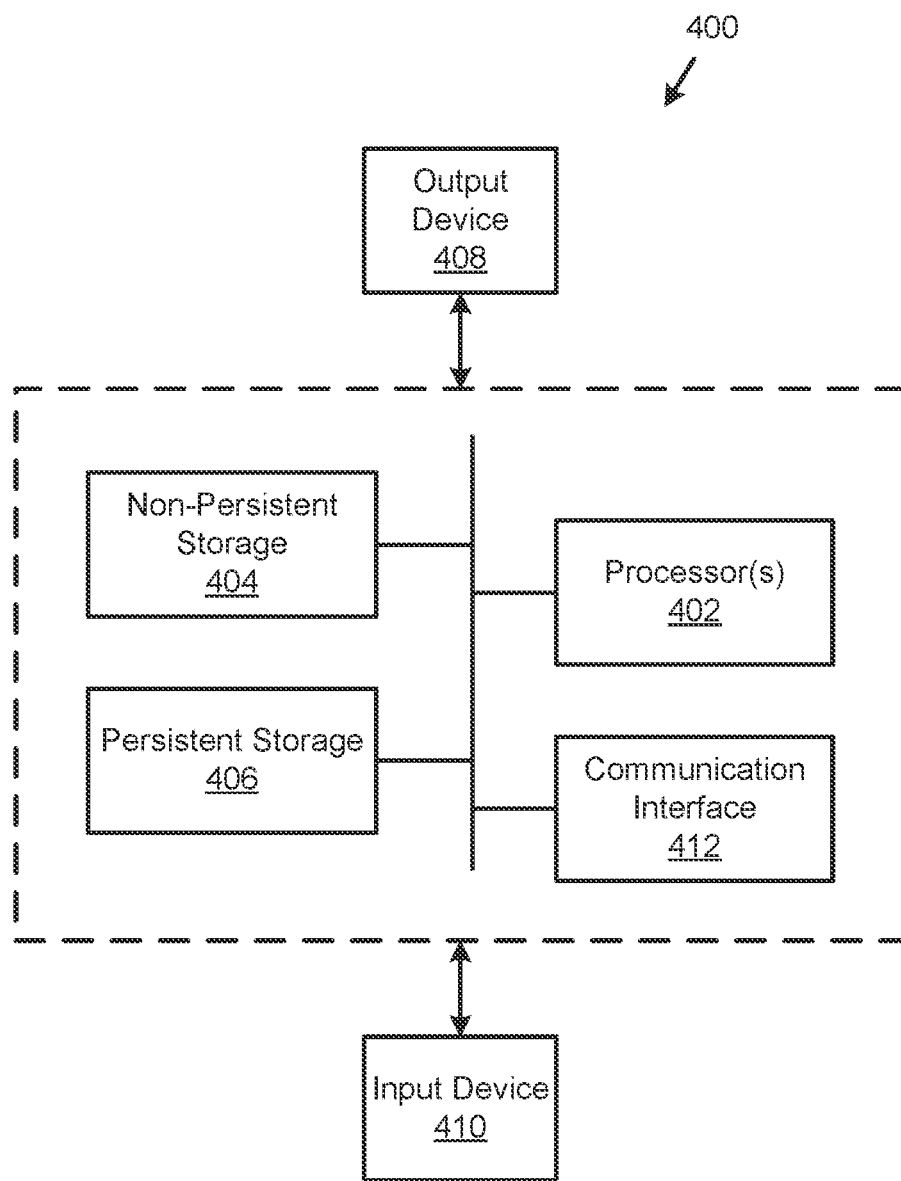
FIG. 4 shows a diagram of a computing device in accordance with one or more embodiments of the invention.

In one or more embodiments of the invention, the deduplicator (132) is implemented as a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the deduplicator (132) described throughout this application and/or all, or a portion thereof, of the method illustrated in FIG. 2.

In one or more embodiments of the invention, the deduplicator (132) is implemented as a logical device. The logical device may utilize the computing resources of any number of computing devices and thereby provide the functionality of the deduplicator (132) described throughout this application and/or all, or a portion thereof, of the method illustrated in FIG. 2.

Continuing with the discussion of FIG. 1B, different data nodes in the cluster may include different quantities and/or types of computing resources, e.g., processors providing processing resources, memory providing memory resources, storages providing storage resources, communicators providing communications resources. Thus, the system may include a heterogeneous population of nodes.

The heterogeneous population of nodes may be logically divided into an accelerator pool (130) including nodes that have more computing resources, e.g., high performance nodes (134, 136) than other nodes and a non-accelerator pool (150) including nodes that have fewer computing resources, e.g., low performance nodes (154, 156) than the nodes in the accelerator pool (130). For example, nodes of the accelerator pool (130) may include enterprise class solid state storage resources that provide very high storage bandwidth, low latency, and high input-outputs per second (IOPS). In contrast, the nodes of the non-accelerator pool (150) may include hard disk drives that provide lower storage performance. While illustrated in FIG. 1B as being divided into two groups, the nodes may be divided into any number of groupings based on the relative performance level of each node without departing from the invention.

In one or more embodiments of the invention, the data nodes (134, 136, 154, 156) store data chunks and parity chunks. The data nodes (134, 136, 154, 156) may include persistent storage that may be used to store the data chunks and parity chunks. The generation of the data chunks and parity chunks is described below with respect to FIG. 2.

In one or more embodiments of the invention, the non-accelerator pool (150) includes any number of fault domains. In one or more embodiments of the invention, a fault domain is a logical grouping of nodes (e.g., data nodes) that, when one node of the logical grouping of nodes goes offline and/or otherwise becomes inaccessible, the other nodes in the logical grouping of nodes are directly affected. The effect of the node going offline to the other nodes may include the other nodes also going offline and/or otherwise inaccessible. The non-accelerator pool (150) may include multiple fault domains. In this manner, the events of one fault domain in the non-accelerator pool (150) may have no effect to other fault domains in the non-accelerator pool (150).

For example, two data nodes may be in a first fault domain. If one of these data nodes in the first fault domain experiences an unexpected shutdown, other nodes in the first fault domain may be affected. In contrast, another data node in the second fault domain may not be affected by the unexpected shutdown of a data node in the first fault domain. In one or more embodiments of the invention, the unexpected shutdown of one fault domain does not affect the nodes of other fault domains. In this manner, data may be replicated and stored across multiple fault domains to allow high availability of the data.

In one or more embodiments of the invention, each data node (134, 136, 154, 156) is implemented as a computing device (see e.g., FIG. 4). The computing device may be, for example, a laptop computer, a desktop computer, a server, a distributed computing system, or a cloud resource (e.g., a third-party storage system accessible via a wired or wireless connection). The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the data node (134, 136, 154, 156) described throughout this application and/or all, or a portion thereof, of the method illustrated in FIG. 2.

In one or more embodiments of the invention, the data nodes (134, 136, 154, 156) are implemented as a logical device. The logical device may utilize the computing resources of any number of computing devices and thereby provide the functionality of the data nodes (134, 136, 154, 156) described throughout this application and/or all, or a portion thereof, of the method illustrated in FIG. 2.

FIG. 2 shows a flowchart for storing data in a data cluster in accordance with one or more embodiments of the invention. The method shown in FIG. 2 may be performed by, for example, a deduplicator (132, FIG. 1B). Other components of the system illustrated in FIG. 1B may perform the method of FIG. 2 without departing from the invention. While the various steps in the flowchart are presented and described sequentially, one of ordinary skill in the relevant art will appreciate that some or all of the steps may be executed in different orders, may be combined or omitted, and some or all steps may be executed in parallel.

In step 200, data is obtained from a host. The data may be a file, a file segment, a collection of files, or any other type of data without departing from the invention. The data may be obtained in response to a request to store data and/or backup the data. Other requests may be used to initiate the method without departing from the invention.

In step 202, confirmation is sent to the host. In one or more embodiments of the invention, the confirmation is an acknowledgement (ACK) that confirms receipt of the data by the data cluster. At this stage, from the perspective of the host, the data has been backed up. This is the case even though data cluster is still performing the method shown in FIG. 2.

In step 204, an erasure coding procedure is performed on the data to generate data chunks and parity chunks. In one or more embodiments of the invention, the erasure coding procedure includes dividing the data of the obtained data into portions, referred to as data chunks. Each data chunk may include any number of data segments associated with the obtained data. The individual data chunks may then be combined (or otherwise grouped) into stripes (also referred to as Redundant Array of Independent Disks (RAID) stripes). One or more parity values are then calculated for each of the aforementioned stripes. The number of parity stripes may vary based on the erasure coding algorithm that is being used as part of the erasure coding procedure. Non-limiting examples of erasure coding algorithms are RAID-4, RAID-5, and RAID-6. Other erasing coding algorithms may be used without departing from the invention. Continuing with the above discussion, if the erasing code procedure is implementing RAID 4, then a single parity value is calculated. The resulting parity value is then stored in a parity chunk. If erasure coding procedure algorithm requires multiple parity values to be calculated, then the multiple parity values are calculated with each parity value being stored in a separate data chunk.

As discussed above, the data chunks are used to generate parity chunks in accordance with the erasure coding procedure. More specifically, the parity chunks may be generated by applying a predetermined function (e.g., P Parity function, Q Parity Function), operation, or calculation to at least one of the data chunks. Depending on the erasure coding procedure used, the parity chunks may include, but are not limited to, P parity values and/or Q parity values.

In one embodiment of the invention, the P parity value is a Reed-Solomon syndrome and, as such, the P Parity function may correspond to any function that can generate a Reed-Solomon syndrome. In one embodiment of the invention, the P parity function is an XOR function.

In one embodiment of the invention, the Q parity value is a Reed-Solomon syndrome and, as such, the Q Parity function may correspond to any function that can generate a Reed-Solomon syndrome. In one embodiment of the invention, a Q parity value is a Reed-Solomon code. In one embodiment of the invention, $Q=g_0 \cdot D_0 + g_1 \cdot D_1 + g_2 \cdot D_2 + \ldots + g_{n-1} \cdot D_{n-1}$, where Q corresponds to the Q parity, g is a generator of the field, and the value of D corresponds to the data in the data chunks.

In one or more embodiments of the invention, the number of data chunks and parity chunks generated is determined by the erasure coding procedure, which may be specified by the host, by the data cluster, and/or by another entity. In step 206, deduplication is performed on the data chunks to obtain deduplicated data chunks. In one or more embodiments of the invention, the deduplication is performed in the accelerator pool by identifying the data chunks of the obtained data and assigning a fingerprint to each data chunk. A fingerprint is a unique identifier (e.g., a D-ID) that may be stored in metadata of the data chunk. The deduplicator performing the deduplication may generate a fingerprint for a data chunk and identify whether the fingerprint matches an existing fingerprint stored in the deduplicator. If the fingerprint matches an existing fingerprint, the data chunk may be deleted, as it is already stored in the data cluster. If the fingerprint does not match any existing fingerprints, the data chunk may be stored as a deduplicated data chunk. Additionally, the fingerprint is stored in the deduplicator for deduplication purposes of future obtained data.

In one or more embodiments of the invention, the deduplicated data chunks collectively make up the deduplicated data. In one or more embodiments of the invention, the deduplicated data chunks are the data chunks that were not deleted during deduplication.

In step 208, the deduplicated data chunks and parity chunks are distributed across data nodes in a non-accelerator pool. The deduplicated data chunks and parity chunks may be sent to data nodes of the non-accelerator pool in the data cluster. The data nodes may store the respective deduplicated data chunks and parity chunks.

In one or more embodiments of the invention, each data node storing deduplicated data chunks and/or parity chunks of may be a node in a fault domain that is different from fault domains of the other data nodes storing deduplicated data. In this manner, the data chunks and parity chunks may be stored across multiple fault domains in the non-accelerated pool.

For example, consider a scenario in which the data cluster is implementing RAID 3 with a stripe that includes three data chunks and one parity chunk. Further, assume that all three data chunks, after deduplication has been performed, are to be stored in the non-accelerator pool. In this scenario, each of the data chunks (which are now considered deduplicated data chunks) and the parity chunk are stored in separate fault domains (i.e., on nodes within the separate fault domains).

Storing the data chunks and parity chunks in multiple fault domains may be for recovery purposes. In the event that one or more fault domains storing data chunks or parity chunks become inaccessible, the data chunks and/or parity chunks stored in the remaining fault domains may be used to recreate the inaccessible data. In one embodiment of the invention, the deduplicator (or other computing device or logical device) tracks the members of each stripe (i.e., which data chunks and which parity chunks are part of a stripe). This information may be used to aid in any recover operation that is required to be performed on the data stored in the data cluster.

In one embodiment of the invention, the data that is originally obtained in step 200 and/or the deduplicated chunks obtained in step 206 may be: (i) stored on a node in the accelerator pool for a finite period of time (e.g., until it is determined that this data is no longer required in the accelerator pool, where this determination may be made based on a policy); (ii) stored on a node in the accelerator pool until the end of the step 208 and then deleted from the accelerator pool.

EXAMPLE

Figure 3A:
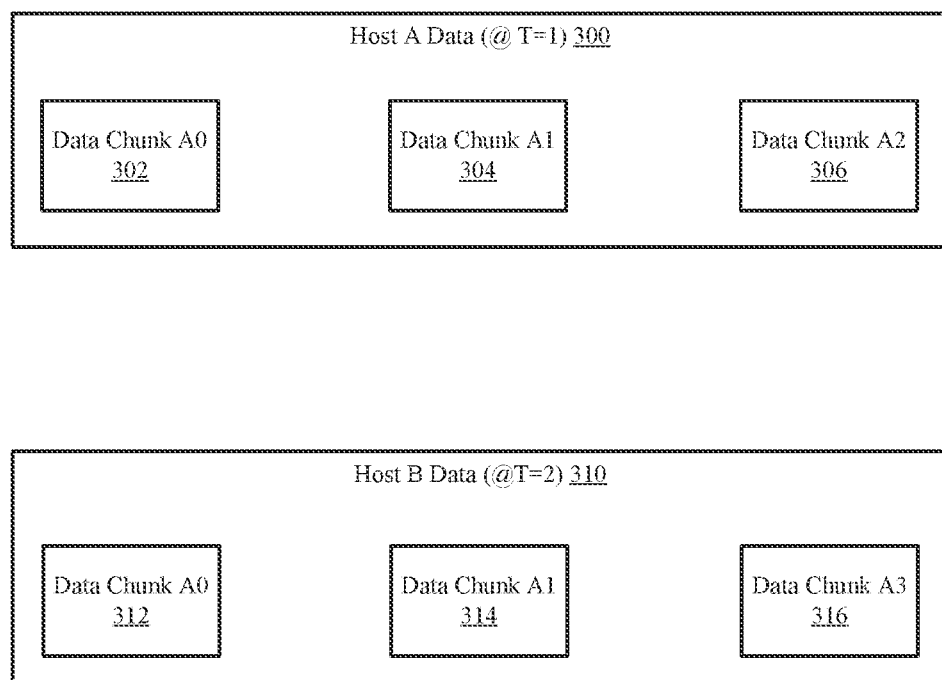
FIGS. 3A-3C show an example in accordance with one or more embodiments of the invention.
Figure 3B:
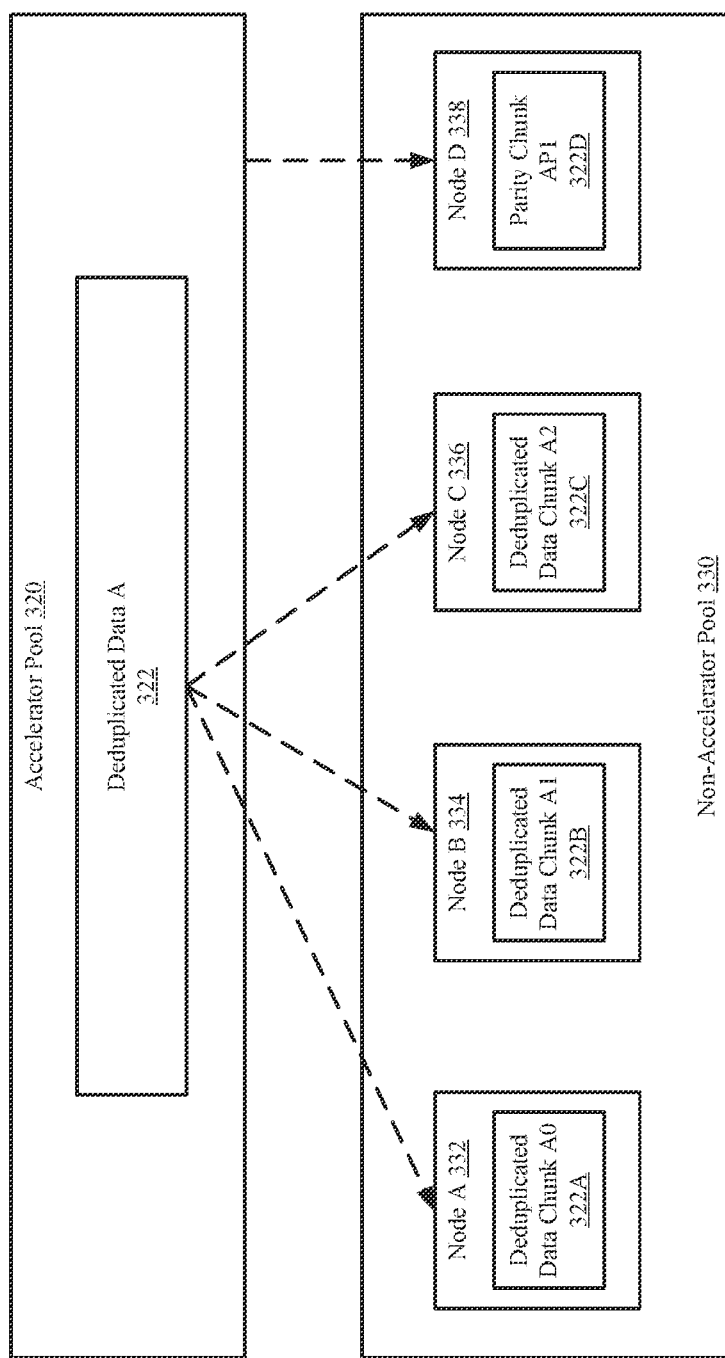
Figure 3C:
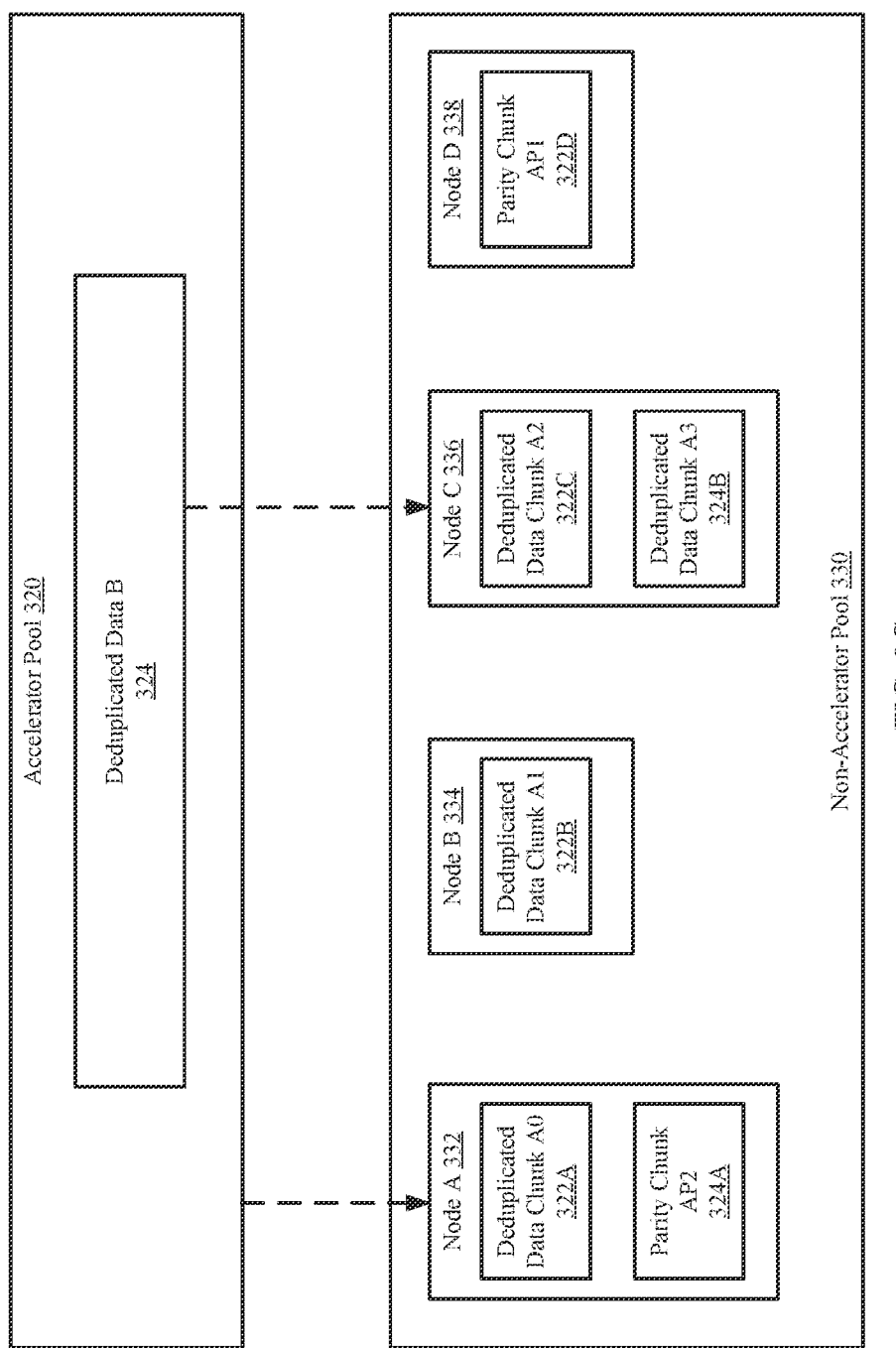

The following section describes an example. The example is not intended to limit the invention. The example is illustrated in FIGS. 3A-3C. Turning to the example, consider a scenario in which a data cluster obtains two versions of host data from two different hosts at two points in time. The respective hosts may request the host data be stored in the data cluster in a 3:1 erasure coding scheme. FIG. 3A shows a diagram of the two versions at the two points in time. Host A data (300) may be obtained at a point in time T=1. Host A data (300) includes data that may be divided into data chunks A0 (302), A1 (304), and A2 (306). At a second point in time T=2, the data cluster obtains host B data (310) that includes data that may be divided into data chunks B0 (312), B1 (314), and B3 (316).

For purposes of this example assume that host A data (300) and host B data (310) are divided into the respective data chunks such that a fingerprint (i.e., a unique identifier) associated with data chunk A0 (312) of host B data (310) is identical to the fingerprint associated with data chunk A0 (302) of host A data (300). Similarly, the fingerprint associated with data chunk A1 (314) of host B data (310) is identical to the fingerprint associated with data chunk A1 (304) of host A data (300). In contrast, the fingerprint associated with data chunk A3 (316) of host B data (310) does not match a fingerprint of any previously stored data chunk. Finally, in this example, assume that the erasure coding process includes implementing RAID 4.

FIG. 3B shows the data cluster after host A data (300) is processed in accordance with FIG. 2. The data cluster may include an accelerator pool (320) that performs the method of FIG. 2 to generate deduplicated data A (322) using host A data (300). The method may include dividing the data into data chunks A0, A1, and A2, where these data chunks are associated with a first stripe. The aforementioned data chunks are then used to generate a parity chunk AP1 using RAID 3.

Because the deduplicated data A (322) is the first data stored in the data cluster, all three data chunks are distributed across nodes in the non-accelerator pool (330) as deduplicated data chunks (322A, 322B, 322C). Deduplicated data chunk A0 (322A) may be stored in a node A (332), deduplicated data chunk A1 (322B) may be stored in a node B (334), deduplicated data chunk A2 (322C) may be stored in a node C (336), and parity chunk AP1 (322D) may be stored in a node D (338). Each node (332, 334, 336, 338) may be a node in a unique fault domain. In this manner, each chunk (322A, 322B, 322C, 322D) is stored in a different fault domain.

At the second point in time T=2, host B data (310) is obtained by the accelerator pool (320). The host B data (310) may be divided into data chunks A0, A1, and A3, where these data chunks are associated with a second stripe. The data chunks in the second stripe are then used to generate a parity chunk AP2. The data chunks in the second stripe are then deduplicated by the deduplicator. The result of the deduplication of the second stripe is that data chunks A0 and A1 exist in the non-accelerator pool and thus are deleted from the host B data (310).

The remaining data chunks associated with deduplicated data B (324), i.e., deduplicated data chunk A3 (324B), may be stored in nodes of the non-accelerator pool (330). The parity chunk AP2 (324A) may be stored in node A (332), and deduplicated data chunk A3 (324B) may be stored in node C (336). FIG. 3C shows the data cluster after the deduplicated data chunks associated with host B data (310) along with the parity chunk AP2 (324A) are stored in the non-accelerator pool (330).

End of Example

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

One or more embodiments of the invention may be implemented using instructions executed by one or more processors of the data management device. Further, such instructions may correspond to computer readable instructions that are stored on one or more non-transitory computer readable mediums.

One or more embodiments of the invention may improve the operation of one or more computing devices. More specifically, embodiments of the invention improve the efficiency of performing storage operations in a data cluster. The efficiency is improved by implementing erasure coding procedures and performing deduplication on data and/or backups of data. The erasure coding procedure includes generating parity data associated with the data. The deduplicated data and the parity data may be stored across multiple fault domains. In this manner, if any number of fault domains become inaccessible prior to recovery of data, portions of data stored in the remaining fault domains may be used to recreate the data. This method may replace the need to mirror (i.e., store multiple copies of) the data across the fault domains, thus reducing the amount of storage used for storing data while maintaining policies in the event of fault domain failures.

Further, embodiments of the invention improve the deduplication by upgrading the nodes performing a deduplication which increases processing capabilities of the node and reduces processing time compared to non-upgraded nodes performing the deduplication.

Thus, embodiments of the invention may address the problem of inefficient use of computing resources. This problem arises due to the technological nature of the environment in which storage operations are performed.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for storing data, the method comprising:
   obtaining data;
   applying an erasure coding procedure to the data to obtain a plurality of data chunks and at least one parity chunk;
   deduplicating the plurality of data chunks to obtain a plurality of deduplicated data chunks, wherein deduplicating the plurality of data chunks to obtain the plurality of deduplicated data chunks is performed after a parity value for the plurality of data chunks is generated by performing an erasure coding procedure; and
   storing, across a plurality of nodes, the plurality of deduplicated data chunks and the at least one parity chunk.

2. The method of claim 1, wherein the erasure coding procedure is applied by a deduplicator executing on a node in an accelerator pool, wherein the plurality of nodes is located is a non-accelerator pool, and wherein a data cluster comprises the accelerator pool and the non-accelerator pool.

3. The method of claim 1, wherein applying the erasure coding procedure comprises:
   dividing the data into data chunks;
   selecting, from the data chunks, the plurality of data chunks; and
   generating the at least one the parity chunk using the plurality of data chunks.

4. The method of claim 1, wherein the at least one parity chunk comprises a P parity value.

5. The method of claim 1, wherein the at least one parity chunk comprises a first parity chunk comprising a P parity value and a second parity chunk comprising a Q parity value.

6. The method of claim 1, wherein each of the plurality of nodes is in a separate fault domain.

7. A non-transitory computer readable medium comprising computer readable program code, which when executed by a computer processor enables the computer processor to perform a method for storing, the method comprising:
   obtaining data;
   applying an erasure coding procedure to the data to obtain a plurality of data chunks and at least one parity chunk;
   deduplicating the plurality of data chunks to obtain a plurality of deduplicated data chunks, wherein deduplicating the plurality of data chunks to obtain the plurality of deduplicated data chunks is performed after a parity value for the plurality of data chunks is generated by performing an erasure coding procedure; and
   storing, across a plurality of nodes, the plurality of deduplicated data chunks and the at least one parity chunk.

8. The non-transitory computer readable medium of claim 7, wherein the erasure coding procedure is applied by a deduplicator executing on a node in an accelerator pool, wherein the plurality of nodes is located is a non-accelerator pool, and wherein a data cluster comprises the accelerator pool and the non-accelerator pool.

9. The non-transitory computer readable medium of claim 7, wherein applying the erasure coding procedure comprises:
   dividing the data into data chunks;
   selecting, from the data chunks, the plurality of data chunks; and
   generating the at least one the parity chunk using the plurality of data chunks.

10. The non-transitory computer readable medium of claim 7, wherein the at least one parity chunk comprises a P parity value.

11. The non-transitory computer readable medium of claim 7, wherein the at least one parity chunk comprises a first parity chunk comprising a P parity value and a second parity chunk comprising a Q parity value.

12. The non-transitory computer readable medium of claim 7, wherein each of the plurality of nodes is in a separate fault domain.

13. A data cluster, comprising:
   a plurality of data nodes comprising an accelerator pool and a non-accelerator pool, wherein the accelerator pool comprises a data node, and the non-accelerator pool comprises a plurality of data nodes;
   wherein the data node of the plurality of data nodes is programmed to:
      obtain data;
      apply an erasure coding procedure to the data to obtain a plurality of data chunks and at least one parity chunk;
      deduplicate the plurality of data chunks to obtain a plurality of deduplicated data chunks, wherein deduplicating the plurality of data chunks to obtain the plurality of deduplicated data chunks is performed after a parity value for the plurality of data chunks is generated by performing an erasure coding procedure; and
      store, across the plurality of nodes, the plurality of deduplicated data chunks and the at least one parity chunk.

14. The data cluster of claim 13, wherein applying the erasure coding procedure comprises:
   dividing the data into data chunks;
   selecting, from the data chunks, the plurality of data chunks; and
   generating the at least one the parity chunk using the plurality of data chunks.

15. The data cluster of claim 13, wherein the at least one parity chunk comprises a P parity value.

16. The data cluster of claim 13, wherein the at least one parity chunk comprises a first parity chunk comprising a P parity value and a second parity chunk comprising a Q parity value.

17. The data cluster of claim 13, wherein each of the plurality of nodes is in a separate fault domain.

* * * * *